United States Patent
Vilajosana Guillén et al.

(10) Patent No.: US 10,912,051 B2
(45) Date of Patent: Feb. 2, 2021

(54) DRIFT CORRECTION IN A WIRELESS NETWORK

(71) Applicant: FUNDACIÓ PER A LA UNIVERSITAT OBERTA DE CATALUNYA, Barcelona (ES)

(72) Inventors: Xavier Vilajosana Guillén, Cardedeu (ES); Borja Martínez Huerta, Sant Cugat del Vallés (ES); Ferran Adelantado Freixer, Rubí (ES); Pere Tuset Peiró, Granollers (ES)

(73) Assignee: FUNDACIÓ PER A LA UNIVERSITAT OBERTA DE CATALUNYA, Barcelona (ES)

( * ) Notice: Subject to any disclaimer, the term of this patent is extended or adjusted under 35 U.S.C. 154(b) by 103 days.

(21) Appl. No.: 16/318,111

(22) PCT Filed: Jul. 22, 2016

(86) PCT No.: PCT/EP2016/067541
§ 371 (c)(1),
(2) Date: Jan. 15, 2019

(87) PCT Pub. No.: WO2018/014970
PCT Pub. Date: Jan. 25, 2018

(65) Prior Publication Data
US 2019/0246367 A1   Aug. 8, 2019

(51) Int. Cl.
*H04W 56/00* (2009.01)
*H03J 3/04* (2006.01)
(Continued)

(52) U.S. Cl.
CPC .......... *H04W 56/0015* (2013.01); *G06F 1/12* (2013.01); *H03J 3/04* (2013.01); *H03L 1/02* (2013.01)

(58) Field of Classification Search
None
See application file for complete search history.

(56) References Cited

U.S. PATENT DOCUMENTS

| 7,388,541 B1 * | 6/2008 | Yang | G01C 21/206 342/464 |
| 7,764,133 B1 * | 7/2010 | Nicholls | H03L 1/022 331/176 |

(Continued)

FOREIGN PATENT DOCUMENTS

WO   WO 02/093748 A1   11/2002

OTHER PUBLICATIONS

International Search Report and Written Opinion dated Mar. 21, 2017 for International Application No. PCT/EP2016/067541, 13 pages.

*Primary Examiner* — Huy D Vu
*Assistant Examiner* — Bao G Nguyen
(74) *Attorney, Agent, or Firm* — Squire Patton Boggs (US) LLP

(57) ABSTRACT

Methods and devices for synchronizing a device clock in a wireless network (e.g. a LPWAN) are disclosed. Example methods comprise identifying a device temperature, identifying a clock drift associated with the identified device temperature and applying a correction to the device clock based on the identified drift. For the identified device temperature, the drift is identified by comparing the confidence of the drift value in a pre-calibration curve generated from fixed drift values in a pre-calibration table with the confidence of the drift value in a learning curve generated from variable drift values in a learning table and selecting the drift value from the curve having the higher drift confidence.

18 Claims, 5 Drawing Sheets

(51) Int. Cl.
*H03L 1/02* (2006.01)
*G06F 1/12* (2006.01)

(56) References Cited

U.S. PATENT DOCUMENTS

| | | | |
|---|---|---|---|
| 2010/0216407 A1 | 8/2010 | Gormley | |
| 2013/0097240 A1* | 4/2013 | Ling | H04L 12/2801 |
| | | | 709/204 |
| 2015/0244513 A1* | 8/2015 | Hartman | H04J 3/0638 |
| | | | 370/350 |
| 2016/0197800 A1* | 7/2016 | Hui | H04L 41/0853 |
| | | | 370/252 |

* cited by examiner

DRIFT CORRECTION IN A WIRELESS NETWORK

The present disclosure relates to methods and devices for correcting clock drift in wireless networks.

BACKGROUND

The emergence of Low Power Wide Area Network (LPWAN) technologies is accelerating the deployment of operated networks providing seamless Machine to Machine (M2M) communication services using a similar service model to that of cellular networks. Those technologies are a key answer for large sensor deployments, as smart metering and other smart city applications, on which low-power operation is critical, while communication requirements are loose and time insensitive.

Those applications share two main characteristics: a restrictive duty-cycled operation and very long periods between reports to a central unit to increase battery life and regulate the use of the spectrum.

The latest LPWAN technologies such as LoRaWAN, Sigfox, Ingenu, Weightless or NB-IOT make use of very robust modulations, exploiting narrow band communications or spread spectrum techniques such as Chirp Spread Spectrum (CSS). This ensures long range links supported by powerful decoders at reception, avoiding multi-hop approaches. Some of this technologies use simple Aloha medium access, subject to contention and limited performance under congestion at around 18%.

Aloha based technologies rely on retransmissions to cope with contention. Due to their low data rate and long range coverage, the cost of retransmissions after collision has an important impact in the network throughput and energy consumption. Given the extremely low data rates and strict duty cycle regulations, these technologies are constrained in the number of packets to be transmitted per hour.

Conversely, Synchronized approaches, based on TDMA, usually require a GPS pulse per second to maintain synchronization and keep their clocks aligned. GPS transducers are expensive in terms of cost and energy and limit the lifespan of those synchronized technologies.

In order to improve the performance of Aloha based technologies and to reduce the energy consumption of GPS-based synchronized LPWANs, adaptive synchronization techniques are required. In an adaptive synchronization approach, the nodes' individual clocks are synchronized and re-aligned periodically to compensate for crystal clock natural drift, temperature dependence and inherent variability. These combined effects accumulate an important error in long sleep periods, which must be compensated to reduce guard times in the communicating slots. Usually, the synchronization accuracy in a node is based on realigning its internal clock with a time source neighbor through radio communication or using another local timing source such as a GPS to obtain a universal time reference.

Most common TDMA approaches use a periodic signal to align nodes clock considering that the drift for the inter-packet period is smaller than the MAC layer guard time. In LPWAN technologies, however, the duty cycle and energy consumption constraints limit that period to a number several orders of magnitude larger than that of current approaches, which directly impacts to the MAC layer guard time.

It would be desirable to provide a clock synchronization mechanism and architecture that at least partially resolves the above mentioned problems.

SUMMARY

A method to improve clock frequency accuracy and reduce the long-term drift is proposed. This method combines a discipline mechanism to align the clock to a reference with a drift compensation based on thermal characterization of the device. The method relies on eventual clock realignment to a time source reference combined with adaptive drift rate prediction and automatic compensation using two correction tables. The clock may be a crystal clock, a digital oscillator or any other clock source. The drift is estimated from curves generated through the interpolation of actual drift-temperature pairs contained in tables describing the drift-temperature relation characteristic of the device.

In a first aspect, a method of improving the accuracy of a device clock is disclosed. The method comprises identifying a device temperature, identifying a clock drift associated with the identified temperature and applying a correction to the device clock based on the identified drift. For the identified device temperature, the drift is identified by comparing the confidence of the drift value in a pre-calibration curve generated from fixed drift values in a pre-calibration table with the confidence of the drift value in a learning curve generated from variable drift values in a learning table and selecting the drift value from the curve having the higher drift confidence. The identified temperature may be the average temperature between two synchronizations. The second table, i.e. the learning table, is maintained so that its values may be updated over time with the purpose of increasing the confidence of the drift values it may store. The values of the pre-calibration table remain the same and are pre-set during the production stage without taking into consideration the peculiarities of the specific clock. Thus, as the learning table may be updated with values acquired based on the actual drift experience of the specific clock, it may provide higher confidence drift values over time, thus achieving less dependency on the pre-calibration table.

By applying a correction from either the curve obtained from the pre-calibration table or from the curve obtained from the learning table, based on the maximum confidence, a one part per million (1 ppm) drift may be achieved.

In some examples a training algorithm may be used to update the learning curve. The training algorithm may be a polynomial fitting algorithm, e.g. a second order polynomial fitting algorithm such as a least squares second order fitting.

In some examples, the method may further comprise receiving a synchronization signal from a remote source. This may comprise receiving an event from a remote device, or receiving a synchronization packet from a remote node, aligning the clock based on data in the synchronization packet and updating the variable drift values of the learning table using said data in the synchronization packet. The terms "synchronization event", "synchronization signal" and "synchronization packet" are used interchangeably and may refer to any type of event or data reception that may allow synchronization of the device clock. The method may take advantage of sparse packet-based synchronization events to improve the calibration information, and to progressively refine the drift-temperature characteristic according to the real measured behavior. During the operation of a node, a drift-temperature fitted curve may be used to correct the drift given the average temperature for that inter-synchronization period. Using the inferred curve, a device may track its drift and compensate it when needed either periodically, when the node is required to be always perfectly synchronized, or eventually, right before a desired event. Upon reception of a synchronization event from a time reference source, the measured drift value may be used to update the fitting curve, as well as to realign the clock of the receiving node to the reference either when the synchronization event is received or later.

In some examples, applying a correction may comprise identifying a number of ticks to correct and applying the identified number of ticks to the clock. Applying the identified number of ticks may comprise adding or subtracting the identified number of ticks to the clock counter to account for a positive or negative drift, respectively.

In some examples, the method may further comprise adjusting a guard time based on the confidence of the drift value in the learning curve. Knowing the drift value with a higher confidence may allow for a more precise adjustment of the guard time.

In another aspect, device to synchronize a clock in a wireless network is disclosed. The device may comprise means for identifying a clock temperature; means for identifying a drift associated with the identified temperature; and means for applying a correction to the clock based on the identified drift. For the identified clock temperature, the means for identifying drift may comprise means for comparing the confidence of the drift value in a pre-calibration curve generated from fixed drift values in a pre-calibration table with the confidence of the drift values in a learning curve generated from variable drift values in a learning table and selecting the drift value from the curve having the higher confidence.

In some examples, the device may further comprise means for storing the pre-calibration table and means for storing the learning table. The means for storing may be a single or multiple memories.

In some examples, the device may further comprise means for receiving a synchronization packet from a remote node, means for aligning the clock based on data in the synchronization packet, and means for updating the learning table using said data in the synchronization packet.

In another aspect, a wireless device is disclosed. The wireless device may comprise a clock, a temperature sensor, e.g. a thermometer, a drift values module and a drift correction module. The temperature sensor may measure the clock's temperature. The drift values module may comprise a pre-calibration table and a learning table. The pre-calibration table may have temperature values associated with fixed drift values. A respective pre-calibration confidence value may be derivable from the fixed drift values for each temperature. For example, the pre-calibration table may comprise pairs of temperature and drift values. An interpolation algorithm may provide a pre-calibration curve for the pre-calibration table. The respective confidence value of the pre-calibration curve may be derived with statistical methods, obtaining statistical confidence intervals. The learning table may have temperature values associated with variable drift values. An interpolation algorithm may provide a learning curve for the learning table after each update. A respective confidence value for the learning curve may be derived with statistical confidence intervals functions. The drift correction module may be configured to receive a temperature measurement from the temperature sensor and, in response to said measurement reception, compare the confidence of the drift value in the pre-calibration curve with the confidence of the drift value in the learning curve and apply to the clock the drift value from the curve having the higher confidence.

In some examples, the wireless device may further comprise a communication interface, coupled to the drift correction module, to receive a clock synchronization signal from a remote host. The clock synchronization signal may comprise a drift value. The drift correction module may be configured to correct the clock and update the learning table in response to the received clock synchronization signal at the time of receipt of the synchronization signal or at a later time.

In yet another aspect, a computer program product is disclosed. The computer program product may comprise program instructions for causing a computing system to perform a method of synchronizing a clock in a wireless network according to examples disclosed herein.

In yet another aspect, a computing system is disclosed. The computing system may comprise a memory and a processor, embodying instructions stored in the memory and executable by the processor, the instructions comprising functionality to execute a method of synchronizing a clock in a wireless network, according to examples disclosed herein.

In yet another aspect, a computer program product is disclosed. The computer program product may comprise program instructions for causing a computing system to perform a method of synchronizing a clock in a wireless network according to some examples disclosed herein.

The computer program product may be embodied on a storage medium (for example, a CD-ROM, a DVD, a USB drive, on a computer memory or on a read-only memory) or carried on a carrier signal (for example, on an electrical or optical carrier signal).

The computer program may be in the form of source code, object code, a code intermediate source and object code such as in partially compiled form, or in any other form suitable for use in the implementation of the processes. The carrier may be any entity or device capable of carrying the computer program.

For example, the carrier may comprise a storage medium, such as a ROM, for example a CD ROM or a semiconductor ROM, or a magnetic recording medium, for example a hard disk. Further, the carrier may be a transmissible carrier such as an electrical or optical signal, which may be conveyed via electrical or optical cable or by radio or other means.

When the computer program is embodied in a signal that may be conveyed directly by a cable or other device or means, the carrier may be constituted by such cable or other device or means.

Alternatively, the carrier may be an integrated circuit in which the computer program is embedded, the integrated circuit being adapted for performing, or for use in the performance of, the relevant methods.

BRIEF DESCRIPTION OF THE DRAWINGS

Non-limiting examples of the present disclosure will be described in the following, with reference to the appended drawings, in which.

DETAILED DESCRIPTION OF EXAMPLES

Figure 1:
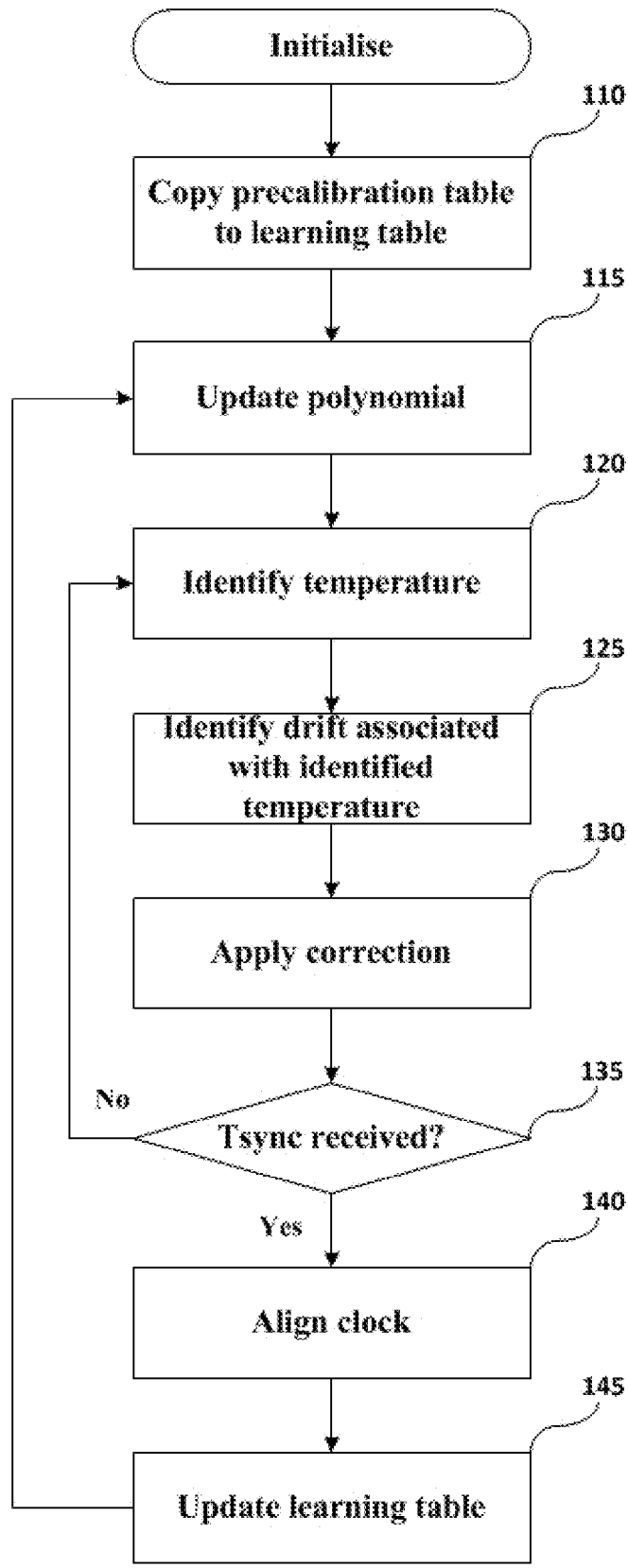
FIG. 1 schematically illustrates a flow chart of a method of synchronizing a clock according to an example.

FIG. 1 schematically illustrates a flow chart of a method of synchronizing a clock according to an example. In block 105 the process may initialize. Then in block 110 a pre-calibration table that may be preinstalled in a first memory, may be copied to a second memory. The second memory may be an updatable memory, e.g. a RAM. Thereafter the copy of the pre-calibration table may be called a learning table. In block 115, based on the content of the learning table, parameters of an interpolation function, e.g. a polynomial, may be updated. The interpolation function may indicate the confidence of the values of the learning table. The interpolation function may be based on statistical confidence intervals functions. It is understood that during the first pass, and while the contents of the learning table are equal to the contents of the pre-calibration table, the confidence of the learning table shall be equal to the confidence of the pre-calibration table. In block 120, a temperature, which may correspond to the average temperature of the device between two synchronizations, may be identified. Then in block 125, a drift value, associated with the identified temperature, may be identified. The process of identifying the drift value shall be explained in detail with reference to FIG. 2. Now, in block 125, when the drift value has been identified, a correction is applied based on the identified drift. Then, in decision block 130, it is checked if a synchronization packet has been received from a remote node. If no synchronization value has been received, then the process continues from block 120 to identify a next average temperature or a temperature change. If a synchronization event or packet has been received, then the process continues to block 135. In block 135, the clock may be aligned, i.e. corrected, based on data (e.g. number of ticks) that may be included in the received synchronization packet. Then, in block 140, the learning table may be updated based on the received data. That is, the drift value received from the remote node may be associated with the identified temperature and may be stored in the learning table. It is noted that the clock correction and the updating of the table are two separate actions that may be performed at the same or at different times. It is also noted that the identified temperature may be the average temperature between two synchronization events. The process then continues in block 115, where the interpolation function, and thus the confidence associated, may be updated based on the new drift values of the updated learning table. Each time a new pair of temperature and drift values is stored, the interpolation function and its associated confidence may be updated with values that correspond to the particular clock. That is, the learning table may be less dependent on values initially acquired from the pre-calibration table which may not be specific to the particular clock or may have changed over time due to aging of the device. As more and more pairs of values are stored in the learning table the level of confidence of the learning table may improve as the pairs of values stored correspond to the characteristics of the specific clock.

Figure 2:
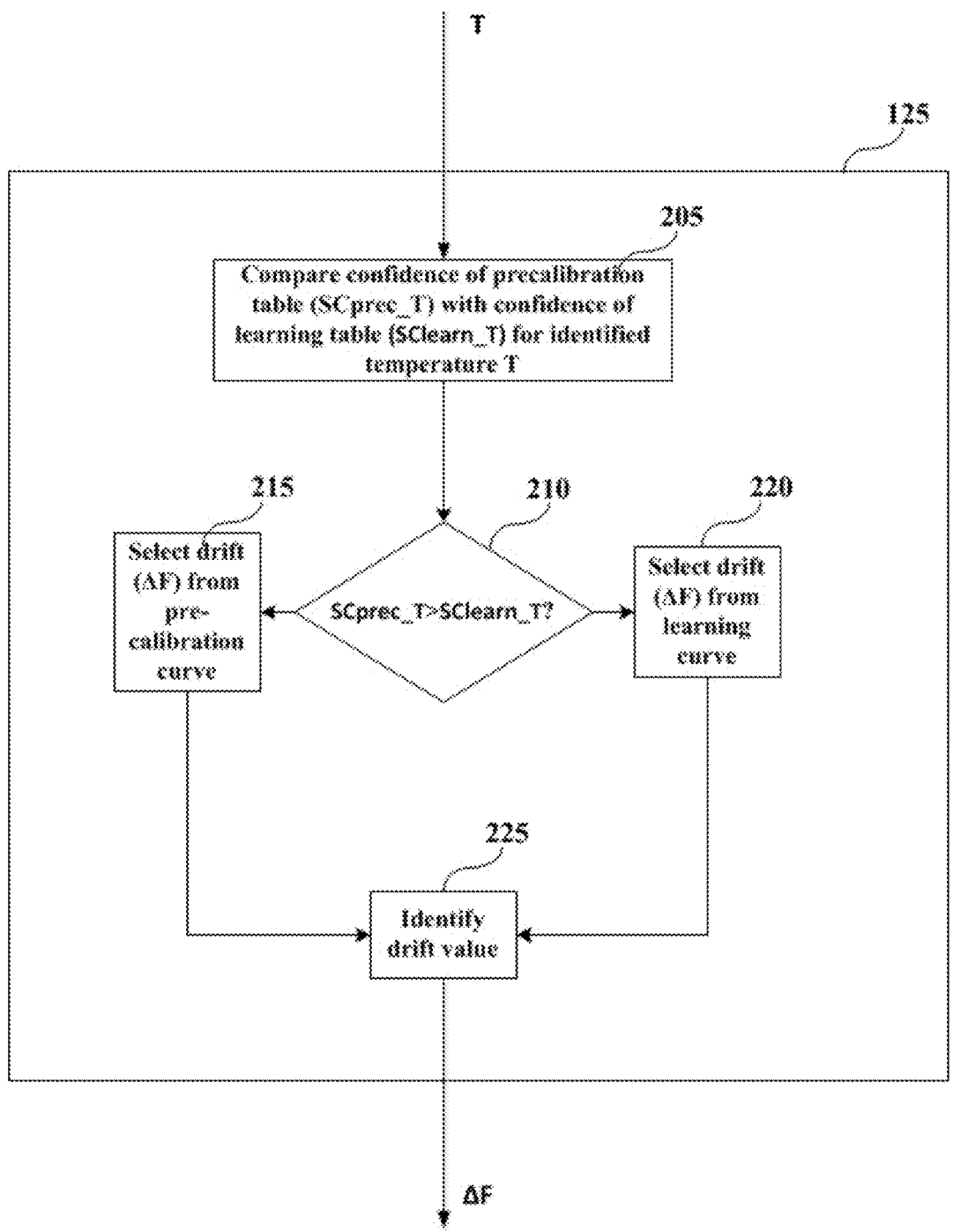
FIG. 2 schematically illustrates a method of identifying drift according to an example.

FIG. 2 schematically illustrates a method of identifying drift according to an example. Identifying drift may substantially correspond to block 125 of FIG. 1. When a temperature is identified, the confidence of the pre-calibration table for the identified temperature is compared with the confidence of the learning table for the identified temperature in box 205. In decision box 210, if the pre-calibration table confidence is greater than the learning table confidence, for the identified temperature, then the process continues to block 215 and a drift value from the pre-calibration curve that may be derived from the pre-calibration table may be selected. If the learning curve's confidence is greater than the pre-calibration table confidence, for the identified temperature, then the process continues to block 220 and a drift value from the learning curve that may be derived from the learning table may be selected. In block 225, the drift value selected, either the one from the pre-calibration curve or the one from the learning curve, may be considered the identified drift for the identified temperature. This identified drift may be used to apply the correction to the clock in block 130 of FIG. 1.

Taking advantage of the derived fitting curve, a device is able to forecast its drift locally, and make use of the predicted error to reduce the guard times and/or increase the interval between synchronization events.

Figure 3A:
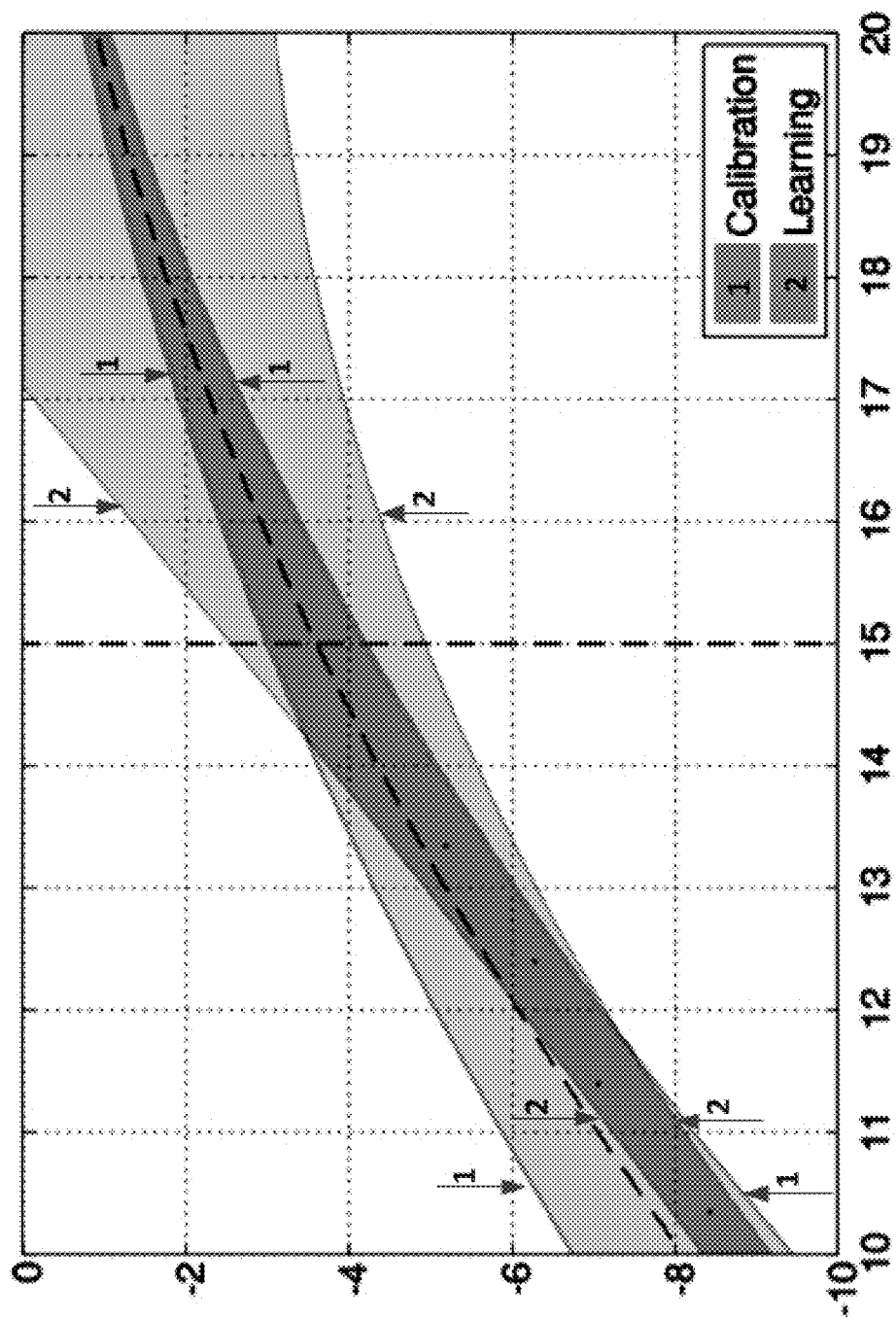
FIG. 3a and FIG. 3b are temperature-drift diagrams illustrating confidence from pre-calibration and from learning tables according to an example.
Figure 3B:
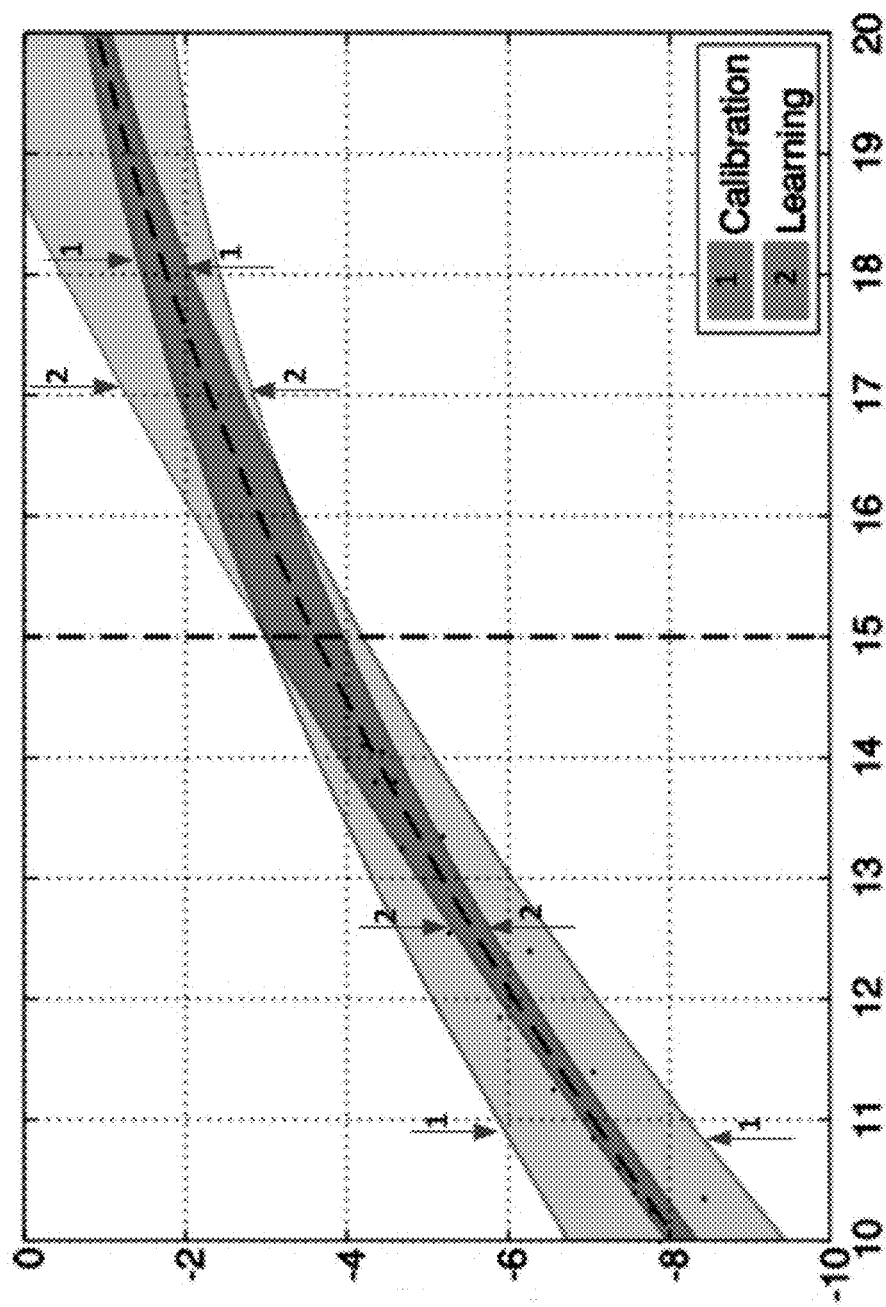

FIG. 3a and FIG. 3b are temperature-drift diagrams illustrating confidence from pre-calibration and from learning tables according to an example. FIG. 3a schematically illustrates a statistical confidence after 12 h of learning while FIG. 3b schematically illustrates a statistical confidence after 24 h of learning. In both diagrams, the horizontal (x) axis indicates temperature (T) from 10 to 20 degrees Celsius, whereas the vertical (y) axis indicates drift (ΔF). The dark grey zone indicates confidence of the pre-calibration table whereas the light grey zone indicates confidence of the learning table.

In the example of FIGS. 3a and 3b, the crystal behavior of the clock may be given by:

$$\Delta F = K(T-T_0)^2 + M_0 \quad \text{(Eq. 1)}$$

Assuming K=0.036±0.006 from the calibration process, the pre-calibration characteristic (P) of FIG. 3a and FIG. 3b may be derived for the temperature range of 10 to 20 degrees Celsius. For example, at T=15° C., the expected drift interval may be: $\Delta F$ (T=15°)ε[−4.20,−3.00] ppm. The specific value for T=15° may be obtained as the intersection (i.e. the average) between the vertical dashed-line and the two dark grey lines, which may represent the upper and lower limits of confidence.

After 12 hours of data acquisition (see Table 1), may results in a statistical confidence interval similar to the light grey area shown in FIG. 3A. The specific values at T=15° may be $\Delta F$ (T=15°)ε[−4.94,−2.56] ppm.

As the statistical confidence of the drift value from the learning table is greater than the confidence of the drift value from the pre-calibration table, the drift value may be selected from the pre-calibration table to predict the new drift.

After 24 hours of data acquisition (see Table 2), a new statistical confidence interval may be derived for T=15° as $\Delta F$ (T=15°)ε[−3.95,−3.00] ppm.

Now, the lower limit of the new statistical interval may be higher (closer to the real value) than the pre-calibration lower limit. Therefore the drift value may be selected from the learning table to predict the new drift.

TABLE 1

| Hour | Temperature [° C.] | Drift [ppm] |
|---|---|---|
| 00:00 | 4.2 | −15.2770 |
| 00:30 | 3.9 | −15.8760 |
| 01:00 | 3.5 | −16.1798 |
| 01:30 | 3.5 | −16.9520 |

TABLE 1-continued

| Hour | Temperature [° C.] | Drift [ppm] |
|---|---|---|
| 02:00 | 3.3 | −16.3328 |
| 02:30 | 2.7 | −17.5828 |
| 03:00 | 2.1 | −18.2250 |
| 03:30 | 1.7 | −19.3766 |
| 04:00 | 1.4 | −19.5440 |
| 04:30 | 1.5 | −20.3918 |
| 05:00 | 1.9 | −19.2100 |
| 05:30 | 1.9 | −19.2100 |
| 06:00 | 1.5 | −19.2100 |
| 06:30 | 1.4 | −20.3918 |
| 07:00 | 2.4 | −19.7122 |
| 07:30 | 3.7 | −17.1086 |
| 08:00 | 4.9 | −15.4256 |
| 08:30 | 6.1 | −13.6890 |
| 09:00 | 7.4 | −11.9246 |
| 09:30 | 8.8 | −10.4040 |
| 10:00 | 10.3 | −8.4272 |
| 10:30 | 11.4 | −7.0560 |
| 11:00 | 12.4 | −6.2726 |
| 11:30 | 13.3 | −5.1840 |

TABLE 2

| Hour | Temperature [° C.] | Drift [ppm] |
|---|---|---|
| 12:00 | 13.8 | −4.5968 |
| 12:30 | 14.0 | −4.4356 |
| 13:00 | 14.1 | −4.1990 |
| 13:30 | 13.8 | −4.3560 |
| 14:00 | 13.2 | −4.6786 |
| 14:30 | 12.5 | −5.2708 |
| 15:00 | 11.8 | −5.8982 |
| 15:30 | 11.2 | −6.5610 |
| 16:00 | 10.8 | −7.0560 |
| 16:30 | 10.6 | −7.3616 |
| 17:00 | 10.4 | −7.5690 |
| 17:30 | 10.2 | −7.7792 |
| 18:00 | 10.0 | −7.8854 |
| 18:30 | 9.7 | −8.3174 |
| 19:00 | 9.5 | −8.5378 |
| 19:30 | 9.3 | −8.7610 |
| 20:00 | 9.2 | −8.8736 |
| 20:30 | 9.0 | −8.9870 |
| 21:00 | 8.8 | −9.3316 |
| 21:30 | 8.6 | −9.5648 |
| 22:00 | 8.2 | −9.8010 |
| 22:30 | 7.8 | −10.4040 |
| 23:00 | 7.6 | −10.7744 |
| 23:30 | 7.5 | −10.8994 |

Figure 4:
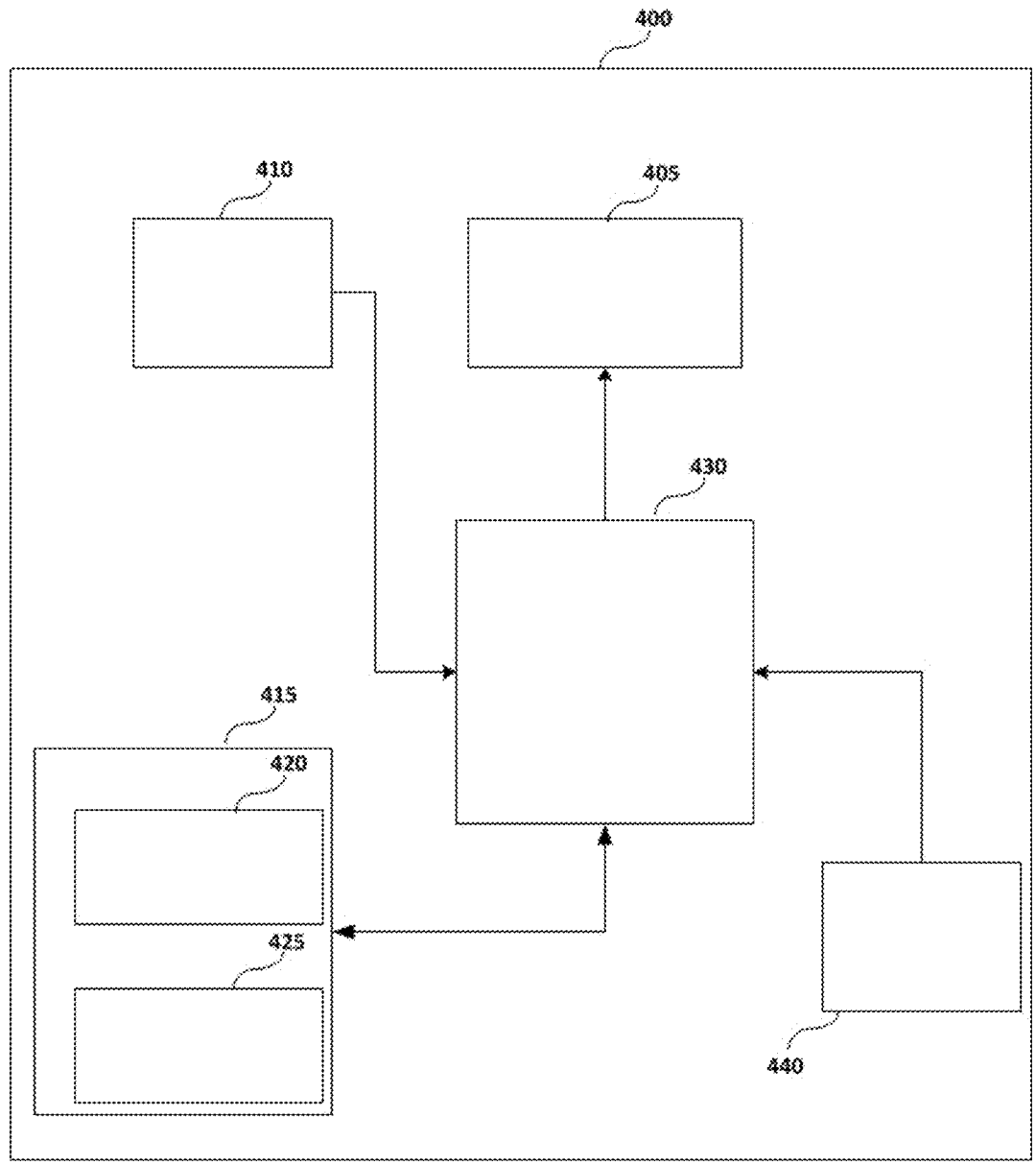
FIG. 4 schematically illustrates a device according to an example. Device 400 may comprise a clock 405.

FIG. 4 schematically illustrates a device according to an example. Device 400 may comprise a clock 405. The device may further comprise a temperature sensor, e.g. a thermometer 410, to measure the device's temperature. The device may further comprise a drift values module 415. The drift values module may comprise a first memory 420 to store a pre-calibration table and a second memory 425 to store a learning table. The pre-calibration table may comprise temperature values associated with fixed drift values, whereby a respective pre-calibration curve with pre-calibration confidence values may be derived or calculated. Alternatively or additionally, as the pre-calibration table is fixed, the first memory may store coefficients of the pre-calibration curve. The learning table may have temperatures values associated with drift values. The device may further comprise a drift correction module 430. The drift correction module 430 may comprise a processor to calculate interpolation curves from the drift values of the two tables and generate associated confidences of the corresponding interpolation curves. The drift correction module 430 may then receive temperature values from the thermometer 410, compare confidence values of the two curves for the received temperature values for the two tables, the pre-calibration and the learning table, and select drift values from the interpolation curve with the higher confidence. Then the drift correction module may apply the selected drift value, i.e. the corresponding number of ticks, to the clock frequency. The device may further comprise a communications module 440 to receive synchronization data from remote sources or nodes.

Although only a number of examples have been disclosed herein, other alternatives, modifications, uses and/or equivalents thereof are possible. Furthermore, all possible combinations of the described examples are also covered. Thus, the scope of the present disclosure should not be limited by particular examples, but should be determined only by a fair reading of the claims that follow. If reference signs related to drawings are placed in parentheses in a claim, they are solely for attempting to increase the intelligibility of the claim, and shall not be construed as limiting the scope of the claim.

Further, although the examples described with reference to the drawings comprise computing apparatus/systems and processes performed in computing apparatus/systems, the invention also extends to computer programs, particularly computer programs on or in a carrier, adapted for putting the system into practice.

The invention claimed is:

1. A method of synchronizing a device clock in a wireless network, comprising:
   identifying a device temperature;
   identifying a clock drift associated with the identified temperature;
   applying a correction to the device clock based on the identified drift,
   wherein, for the identified device temperature, the drift is identified by comparing a statistical confidence of a drift value in a pre-calibration curve generated from fixed drift values in a pre-calibration table with a statistical confidence of a drift value in a learning curve generated from variable drift values in a learning table and selecting the drift value from the curve having the higher drift statistical confidence.

2. The method according to claim 1, further comprising using a training algorithm to update the learning curve.

3. The method according to claim 2, wherein the training algorithm is an interpolation algorithm.

4. The method according to claim 3, wherein the interpolation algorithm is a polynomial algorithm.

5. The method according to claim 4, wherein the polynomial algorithm is a least squares second order polynomial algorithm.

6. The method according to claim 1, further comprising receiving a synchronization signal from a remote source; and
   updating the variable drift values of the learning table using data in the synchronization signal.

7. The method according to claim 6, further comprising aligning the device clock based on the data in the synchronization signal.

8. The method according to claim 1, wherein applying a correction comprises
   identifying a number of ticks to correct, and
   applying the identified number of ticks to the device clock.

9. The method according to claim 8, wherein applying the identified number of ticks comprises adding or subtracting the identified number of ticks to a clock counter to account for a positive or negative drift, respectively.

10. The method according to claim 1 further comprising adjusting a guard time based on the statistical confidence of the drift value in the learning curve.

11. The method according to claim 1, further comprising adjusting a synchronization frequency based on the statistical confidence of the drift value in the learning curve.

12. A device to synchronize a clock in a wireless network, comprising:
    means for identifying a clock temperature,
    means for identifying a drift associated with the identified temperature,
    means for applying a correction to the clock based on the identified drift,
    wherein, for the identified clock temperature, the means for identifying a drift is configured to compare a statistical confidence of a drift value in a pre-calibration curve generated from fixed drift values in a pre-calibration table with a statistical confidence of a drift value in a learning curve generated from variable drift values in a learning table and select the drift value from the curve having the higher statistical confidence.

13. The device according to claim 12, further comprising means for storing the pre-calibration table and means for storing the learning table.

14. The device according to claim 12, further comprising
    means for receiving a synchronization signal from a remote source;
    means for aligning the clock based on data in the synchronization signal;
    means for updating the learning table using the data in the synchronization signal.

15. A wireless device comprising:
    a clock;
    a temperature sensor, to measure the device's temperature;
    a drift values module, comprising a pre-calibration table and a learning table,
        the pre-calibration table having temperature values associated with fixed drift values and respective pre-calibration confidence values, and
    the learning table having temperatures values associated with variable drift values, based on a learning algorithm, and respective variable confidence values, a drift correction module, configured to receive a temperature measurement from the temperature sensor and, in response to the received measurement, generate a pre-calibration curve and a learning curve and compare the statistical confidence of the drift value in the pre-calibration curve with the statistical confidence of the drift value in the learning curve and apply to the clock the drift value from the curve having the higher statistical confidence.

16. The wireless device according to claim 15, further comprising a communication interface, coupled to the drift correction module, and configured to receive a clock synchronization signal from a remote source, the clock synchronization signal comprising a drift value,
    wherein the drift correction module is configured to correct the clock and update the learning table in response to the received clock synchronization signal and an average temperature between the received clock synchronization signal and a previously received clock synchronization signal.

17. The wireless device according to claim 15, comprising a low power wide area network (LPWAN) device.

18. A computer program product comprising program instructions embodied on a non-volatile storage medium for causing a computing system to perform a method according to claim 1.

* * * * *